(12) United States Patent
Van Der Tempel et al.

(10) Patent No.: US 9,726,201 B2
(45) Date of Patent: Aug. 8, 2017

(54) COOLING DEVICE UTILIZING INTERNAL SYNTHETIC JETS

(75) Inventors: Leendert Van Der Tempel, Eindhoven (NL); Jeroen Herman Lammers, Eindhoven (NL); Petrus Johannes Maria Van Os, Heeswijk-Dinther (NL)

(73) Assignee: Philips Lighting Holding B.V., Eindhoven (NL)

( * ) Notice: Subject to any disclaimer, the term of this patent is extended or adjusted under 35 U.S.C. 154(b) by 1292 days.

(21) Appl. No.: 12/746,208

(22) PCT Filed: Nov. 28, 2008

(86) PCT No.: PCT/IB2008/055004
§ 371 (c)(1),
(2), (4) Date: Jun. 4, 2010

(87) PCT Pub. No.: WO2009/072046
PCT Pub. Date: Jun. 11, 2009

(65) Prior Publication Data
US 2010/0258274 A1  Oct. 14, 2010

(30) Foreign Application Priority Data
Nov. 28, 2008 (EP) .................................... 07122623

(51) Int. Cl.
*H05K 7/20* (2006.01)
*F04F 7/00* (2006.01)
(Continued)

(52) U.S. Cl.
CPC ................ *F04F 7/00* (2013.01); *F21V 29/63* (2015.01); *F21V 33/0056* (2013.01); *F21Y 2115/10* (2016.08); *H01L 2924/0002* (2013.01)

(58) Field of Classification Search
CPC ........ G01L 9/12; F05D 2260/201; H05K 7/20
(Continued)

(56) References Cited

U.S. PATENT DOCUMENTS 5,328,331 A * 7/1994 Bunker ................... F01D 5/187
  415/115
5,467,815 A * 11/1995 Haumann ................. F01P 1/02
  165/109.1
(Continued)

FOREIGN PATENT DOCUMENTS

EP     1975505 A1 * 10/2008
JP     2004108760 A    4/2004
(Continued)

*Primary Examiner* — Steven B McAllister
*Assistant Examiner* — Samantha Miller

(57) ABSTRACT

A synthetic jet cooling device (1) for cooling an object (5), comprising: a transducer (10) adapted to generate velocity waves, and an enclosure (4) arranged to receive the velocity waves via an actuated aperture (8). The enclosure (4) is sufficiently large to generate, at the actuated aperture (8), an internal synthetic jet inside the enclosure (4). Furthermore, the enclosure (4) is arranged to contain the object (5), thereby enabling cooling of the object (5) by the internal synthetic jet. The arrangement typically permits multifunctional use of an existing enclosure, containing the object to be cooled, both for its original purpose (e.g. a reflector in a lamp, or a LED backlight module) and as an enclosure generating internal synthetic jets, why the cooling device typically requires virtually no extra space and weight, and can be provided at a low cost.

7 Claims, 5 Drawing Sheets

(51) Int. Cl.
*F21V 33/00* (2006.01)
*F21V 29/63* (2015.01)
*F21Y 115/10* (2016.01)

(58) Field of Classification Search
USPC ...... 454/184; 361/699; 165/104.33, 104, 33;
415/115, 116; 416/96 R, 96 A, 97 R,
416/69 R
See application file for complete search history.

(56) References Cited

U.S. PATENT DOCUMENTS

| | | | |
|---|---|---|---|
| 5,498,133 A * | 3/1996 | Lee | F01D 5/186 416/97 R |
| 5,586,866 A * | 12/1996 | Wettstein | F01D 5/189 416/96 A |
| 6,000,908 A * | 12/1999 | Bunker | F01D 5/189 165/908 |
| 6,123,145 A | 9/2000 | Glezer et al. | |
| 7,092,254 B1 | 8/2006 | Monsef et al. | |
| 7,606,029 B2 * | 10/2009 | Mahalingam et al. | 361/700 |
| 8,127,553 B2 * | 3/2012 | Ekkad | F23R 3/06 165/908 |
| 8,228,675 B2 * | 7/2012 | Koplow | 361/697 |
| 8,522,557 B2 * | 9/2013 | Dawson | F23R 3/06 60/752 |
| 8,667,682 B2 * | 3/2014 | Lee | F23R 3/46 29/890.01 |
| 2006/0185822 A1 * | 8/2006 | Glezer et al. | 165/80.3 |
| 2007/0096118 A1 | 5/2007 | Mahalingam et al. | |

FOREIGN PATENT DOCUMENTS

| | | |
|---|---|---|
| JP | 2007087765 A | 4/2007 |
| WO | 03012866 A1 | 2/2003 |
| WO | 2005027569 A1 | 3/2005 |
| WO | 2007107921 A2 | 9/2007 |
| WO | WO 2007107921 A3 * | 12/2007 |

* cited by examiner

COOLING DEVICE UTILIZING INTERNAL SYNTHETIC JETS

TECHNICAL FIELD

The present invention relates to a cooling device utilizing synthetic jets. The present invention further relates to an electronic device comprising such a cooling device.

BACKGROUND OF THE INVENTION

The need for cooling has increased in various applications due to higher heat flux densities resulting from newly developed electronic devices, being, for example, more compact and/or higher power than traditional devices. An example of this is UHP (Ultra High Performance) lamps and LED (Light Emitting Diode) lamps, where the performance and lifetime is often limited by the heat developed.

In addition to natural convection, fans, either traditional propellers or synthetic jet coolers, can be utilized to enhance the heat transfer by forced convection. A typical synthetic jet actuator is disclosed in U.S. Pat. No. 6,123,145, comprising a housing having a flexible controllable diaphragm. As the diaphragm moves the volume in the chamber changes and vortices are ejected from the chamber through the orifice. The generated synthetic jet stream can impinge on a heated surface thereby cooling this surface.

However, disadvantages associated with prior art are noise, fouling, additional cost, limited lifetime, power dissipation, as well as extra space and weight. As lighting applications are particularly demanding on all these issues (compared to e.g. microprocessors in computers), lighting customers and suppliers are reluctant to accept/introduce active cooling by forced convection. Thus, there is a need for improved active cooling by forced convection.

SUMMARY OF THE INVENTION

In view of the above, an object of the invention is to solve or at least reduce the problems discussed above. In particular, an object is to provide a synthetic jet cooling device for cooling of electronic devices that requires virtually no extra space and weight, at a low additional cost.

According to an aspect of the invention, there is provided a synthetic jet cooling device for cooling an object, comprising a transducer adapted to generate velocity waves, and an enclosure arranged to receive the velocity waves via an actuated aperture, wherein the enclosure is sufficiently large to generate, at the actuated aperture, an internal synthetic jet inside the enclosure. The enclosure is arranged to contain the object, thereby enabling cooling of the object by the internal synthetic jet.

The arrangement enables efficient cooling of an object through vortex shedding and synthetic jet impingement. By utilizing synthetic jets, cooling can be achieved also in essentially stagnating enclosures. Another advantage is that the object to be cooled is contained in the enclosure, why the cooling device typically requires virtually no extra space and weight, and can be provided at a low cost. In particular, this often permits multifunctional use of an existing enclosure, containing the object to be cooled, both for its original purpose (e.g. a reflector in a lamp, or a LED backlight module) and as an enclosure generating internal synthetic jets. Another advantage is that synthetic jets are less obtrusive, as they require only an aperture with diameter 1/10 of the distance between aperture and the cooled object. Thus, for applications in a reflector there is less optical perturbation, due to a small aperture diameter.

A "transducer" is here a device capable of converting an input signal to a corresponding velocity wave output. This input signal may be electric, magnetic or mechanical. Examples of suitable transducers include various types of membranes, pistons, piezoelectric structures and so on. As air pressure (p) and velocity ($\underline{u}$) are coupled p=ρc$\underline{u}$, (where ρ is the density of air and c is the speed of sound in the air) the transducer could also be thought of as generating pressure waves. However, at subsonic frequencies the air will be more or less incompressible, hence the term velocity wave is used here rather than pressure wave, the more so as vortex shedding is generated by air displacement and not by pressure. Furthermore, different types of transducers behave differently. For example, a piston with crank-connecting rod mechanism will impose rather a displacement and a loudspeaker rather a pressure, depending on the frequency.

The present invention is based on the observation of symmetry at an aperture in a wall of an enclosure as fluid in the enclosure is actuated by a transducer, enabling synthetic jets to be generated at either side of the wall rather than just an external jet on the outside of the enclosure, provided that the enclosure is sufficiently deep and big.

A diameter of the actuated aperture is preferably between 1/10 and 1/2 of the distance between the aperture and the cooled object. This has been shown to be advantageous as synthetic jets are typically about 10 times longer than their diameter. Furthermore, the jet should be allowed to propagate freely for a substantial part of the free jet length, why the object distance preferably is at least 1/5 of the free jet length.

The enclosure and the actuated aperture may be dimensioned to act as a resonating mass-spring system actuated by the transducer, wherein fluid in the enclosure acts as a spring, and fluid in the aperture acts as a mass, thereby lowering the power consumption of the transducer and enabling more efficient cooling. An example of such a mass-spring system would be a Helmholtz resonator.

As a loudspeaker itself is a (second) damped mass-spring system it may be advantageous to tune a resonance frequency of a loudspeaker comprising the transducer and a resonance frequency of the mass-spring system formed by the enclosure and the actuated aperture to essentially coincide thereby forming a double mass-spring system. Resonance frequency tuning of the loudspeaker can be achieved, for example, by adding moving mass to the loudspeaker.

According to an embodiment, the stroke (s) of the transducer is preferably larger than the radius ($r_{aperture}$) of the actuated aperture to meet the jet formation criterion is $s > r_{aperture}$.

A volume change introduced by the transducer is preferably ≥1% of the enclosure volume. This helps enhance the jet formation.

The cooling device may comprise at least one cavity in communication with the enclosure via at least one actuated aperture, wherein fluid in said cavity is actuated by said transducer. Here, the at least one cavity is sufficiently small to prevent the fluid therein from acting as a spring in a mass-spring system, and a surface ratio between a surface actuated by the transducer and a surface of the at least one actuated aperture is >>1. The at least one cavity modifies the jet formation criterion from $s > r_{aperture}$ to $$s > r_{aperture} \cdot A_{aperture}/A_{pump},$$

where
s is the stroke of the transducer $r_{aperture}$ is the radius of the aperture,
$A_{aperture}$ is the area of the aperture.
$A_{pump}$ is the area of the actuated surface.

The arrangement is advantageous as the surface ratio between the actuated surface and the aperture boosts vortex shedding and cooling considerably. Furthermore, for embodiments in a reflector this results in small optical perturbation inside the enclosure, as the aperture is much (in prototypes about 50 times) smaller than without a cavity.

According to an embodiment, the actuated aperture is a bore of a tube, wherein the tube is attached to a loudspeaker coil of a loudspeaker comprising the transducer. An advantage associated with this embodiment is that adjustment of the mass of the tube enables tuning of the resonance frequency of the loudspeaker so that it essentially coincides with the resonance frequency of the enclosure. Furthermore, the additional mass of the tube allows operation at a low frequency (order of magnitude 100 Hz) and thereby has a reduced noise level as the minimum audible sound pressure level is relatively high for low frequencies. Thus, sophisticated and expensive noise reduction is not required. The low frequency also extends the life time of the transducer.

According to an embodiment the loudspeaker has a closed back, whereby a first cavity is by formed interior surfaces of the loudspeaker, a flange of the tube, and/or a loudspeaker membrane. An advantage with this embodiment is a fully closed system, which means that, for example, in an application in an UHP-lamp, mercury is confined and cannot escape from the enclosure after burner explosion.

According to an embodiment a housing encloses the front of said loudspeaker, whereby a second cavity is formed, the second cavity being in communication with the enclosure via a second actuated aperture. An advantage of this embodiment is a fully closed system, which means that, for example, in an application in an UHP-lamp, mercury is confined by the second cavity and cannot escape from the enclosure after burner explosion.

The second actuated aperture can be connected to the second cavity via a pipe having a length of $\lambda/2$, where $\lambda$ is the wave length of the velocity waves generated by the loudspeaker.

The enclosure may also comprise at least one non-actuated aperture adapted to generate an additional internal synthetic jet inside the enclosure. This is possible as multiple apertures of any resonating mass-spring system may be driven by a single, or a minority, of actuated apertures. An actuated aperture here refers to an aperture which is primarily driven by a transducer generating pressure waves, whereas a non-actuated aperture refers to an aperture which is primarily driven by the resonating mass-spring system. Utilizing non-actuated apertures enables cooling of multiple objects or hot spots without requiring multiple transducers. As understood by a person skilled in the art the non-actuated aperture alters the resonance frequency of the enclosure. Thus, when applicable, the non-actuated aperture should be taken into account when tuning the resonance frequency of the mass-spring system formed by the enclosure to coincide with the resonance frequency of the loudspeaker.

The synthetic jet cooling device according to the present invention may, furthermore, advantageously be comprised in an electronic device including electronic components.

Other objectives, features and advantages will appear from the following detailed disclosure, from the attached dependent claims as well as from the drawings.

BRIEF DESCRIPTION OF THE DRAWINGS

The above, as well as additional objects, features and advantages of the present invention, will be better understood through the following illustrative and non-limiting detailed description of preferred embodiments of the present invention, with reference to the appended drawings, where the same reference numerals will be used for similar elements, wherein.

DETAILED DESCRIPTION

Figure 1:
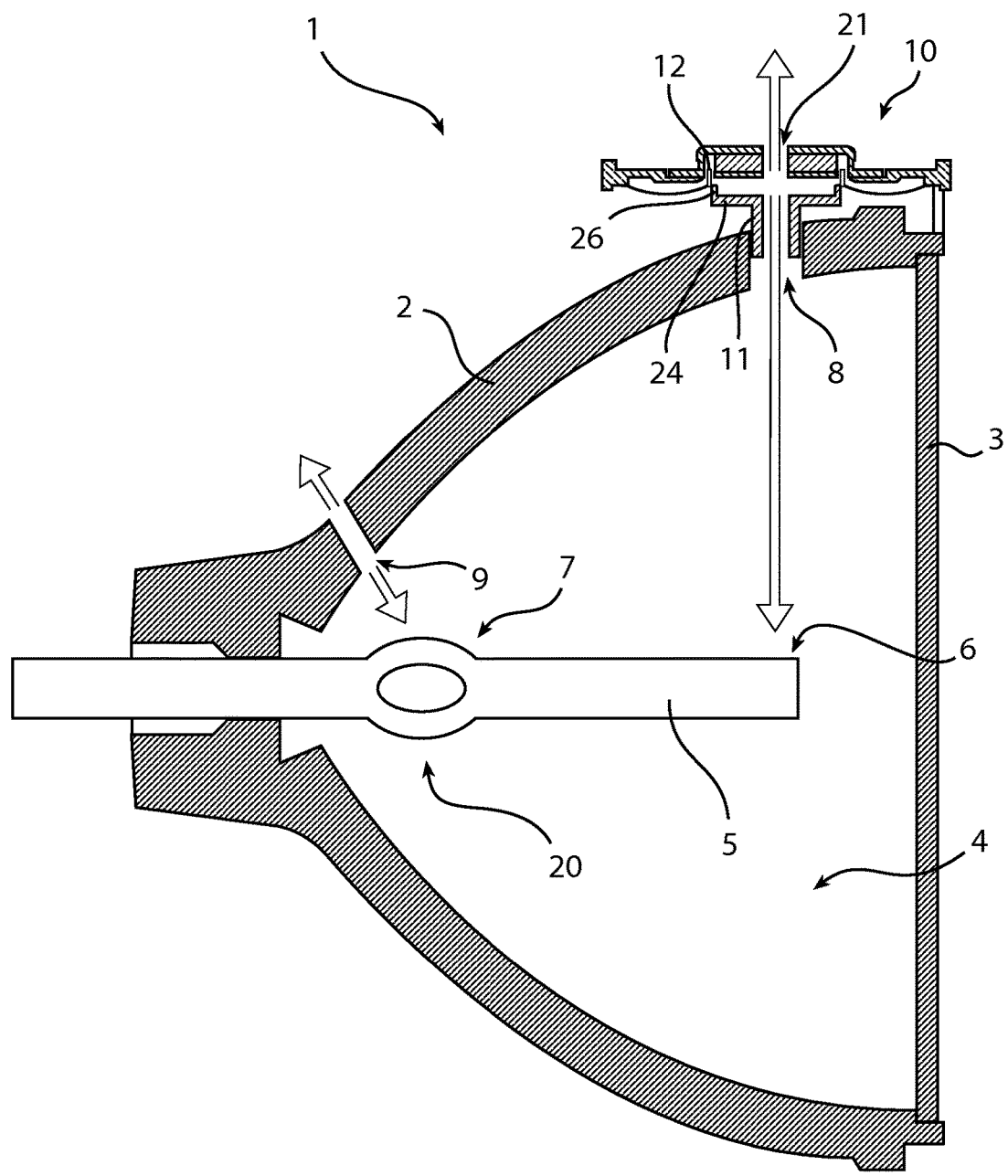
FIG. 1 illustrates an embodiment of a cooling device for an UHP lamp where a loudspeaker, having an open back, actuates a tube whereby both an internal and an external jet is formed at the actuated aperture.

FIG. 1 illustrates an embodiment of the present invention for cooling of an Ultra High Performance (UHP) lamp 1. The UHP lamp 1 comprises a paraboloid reflector 2, and a front glass 3 airtight attached to the reflector 2 thereby forming an enclosure 4. The reflector 2 is here made of glass and has a reflective interior surface. A quartz burner 5 can be arranged inside the UHP lamp 1. For a typical UHP lamp 1, there is a first hot spot 6 located at the front pinch of the quartz burner (i.e. the end of the quartz burner closest to the front glass), and a second hot spot 7 located in the middle of the quartz burner (i.e. halfway between the ends of the quartz burner). Note that, provided that the quartz burner is horizontally arranged, the heat distribution at the middle of the quartz burner is such that the second hot spot 7 is located in the upper part thereof, whereas a cold spot 20 will form in the lower part thereof.

To prevent immanent crystallization these hot spots 6,7 require cooling, without cooling the cold spot 20. To enable cooling of the hotspots 6,7 an actuated aperture 8 and a non-actuated aperture 9 are arranged in the reflector wall.

The actuated aperture 8 is arranged in the reflector wall in a region near the front glass and points towards the hot spot 6 at the front pinch of the quartz burner. Arranging the actuated aperture 8 near the front glass is advantageous as the temperature is lower here (there is a temperature gradient from approximately 200° C. at the actuated aperture 8 up to approximately 400° C. at the non-actuated aperture 9), and moreover space and flatness of the reflector wall simplifies manufacturing. By arranging the actuated aperture 8 at the enclosure upper part, it assists the natural convection loop. If instead placed at the lower part of the reflector it would counteract the natural convection loop. The distance of impingement is preferably such that sufficient vortex shedding of the synthetic jet is allowed.

A transducer 10, here being a loudspeaker, is arranged at the actuated aperture 8. A tube 11 is attached to the loudspeaker coil 12, whereby the bore of the tube 11 forms the actuated aperture. Centering and aligning of the ceramic tube and the loudspeaker is facilitated by the protrusion 26 on the flange 24 that fits in the recess in the cone foil of the loudspeaker at the coil radius. The tube 11 is here a ceramic tube made of e.g. Alsint ceramics with coefficient of thermal expansion (CTE) less than or equal to the glass of the reflector, and can be fixed using suitable adhesive such as glue. The tube 11 fits, with clearance fit, in a hole in the reflector wall. The moment of inertia of the tube with flange is preferably minimized in order to prevent tilting resonance modes, that may induce contact between the tube and the hole in the reflector.

In operation the stroke of the loudspeaker 10 results in a translational motion of the tube 11, introducing a volume change for the enclosure 4. The volume change is preferably ≥1% of the enclosure volume. If the loudspeaker stroke is larger than the radius of the actuated aperture, a jet flow may form at the actuated aperture 8. This results in an internal synthetic jet 12, which impinges on the hot spot 6 at the front pinch of the quartz burner. As the loudspeaker 10 has an opening 21 in the back of the loudspeaker there is also an external jet.

As illustrated in FIG. 1, the non-actuated aperture 9 is arranged in the reflector wall and can, for example, be formed by simply drilling a hole in the reflector wall. The non-actuated aperture is not required, but may be advantageous as it allows cooling of multiple hot spots utilizing a single transducer. The non-actuated aperture 9 here points to the hotspot 7 in the middle of the quartz burner. The diameter of the non-actuated aperture is preferably between ¹⁄₁₀ and ½ of the distance between the non-actuated aperture 9 and the hot spot 7 in the middle of the quartz burner.

The non-actuated aperture 9 differs from the actuated aperture 8 in that there is no transducer arranged to actuate the air. Instead the air in the non-actuated aperture 9 acts as mass driven by the air in the enclosure 4 which acts as a spring. As a result an internal synthetic jet will form at the non-actuated aperture 9, and impinge on the hot spot 7 in the middle of the quartz burner. Furthermore, an external jet forms at the non-actuated aperture.

Each aperture 8,9 can be tapered towards the interior of the enclosure in order to boost the internal jet. Further, the edges of each aperture are preferably sharp to promote vortex shedding. By providing the surface of each aperture 8,9 with grooves shaped as a helix or by having an aperture in the form of an orifice protruding into the enclosure the turbulence of the jet may be further increased or the shedding of vortices promoted. Each aperture 8,9 may communicate with the ambient environment, but often the aperture 8,9 is in communication with an encapsulated volume outside the enclosure. This may be advantageous for example to prevent fouling or to confine mercury upon burner explosion of the UHP lamp. Alternatively, each aperture 8,9 can be equipped with a filter against dust and fouling. The filter may be remote.

The enclosure may also have one or more air exhausts (not illustrated) equipped with check valves to improve gas exchange, flow pattern and vortex shedding.

Figure 2:
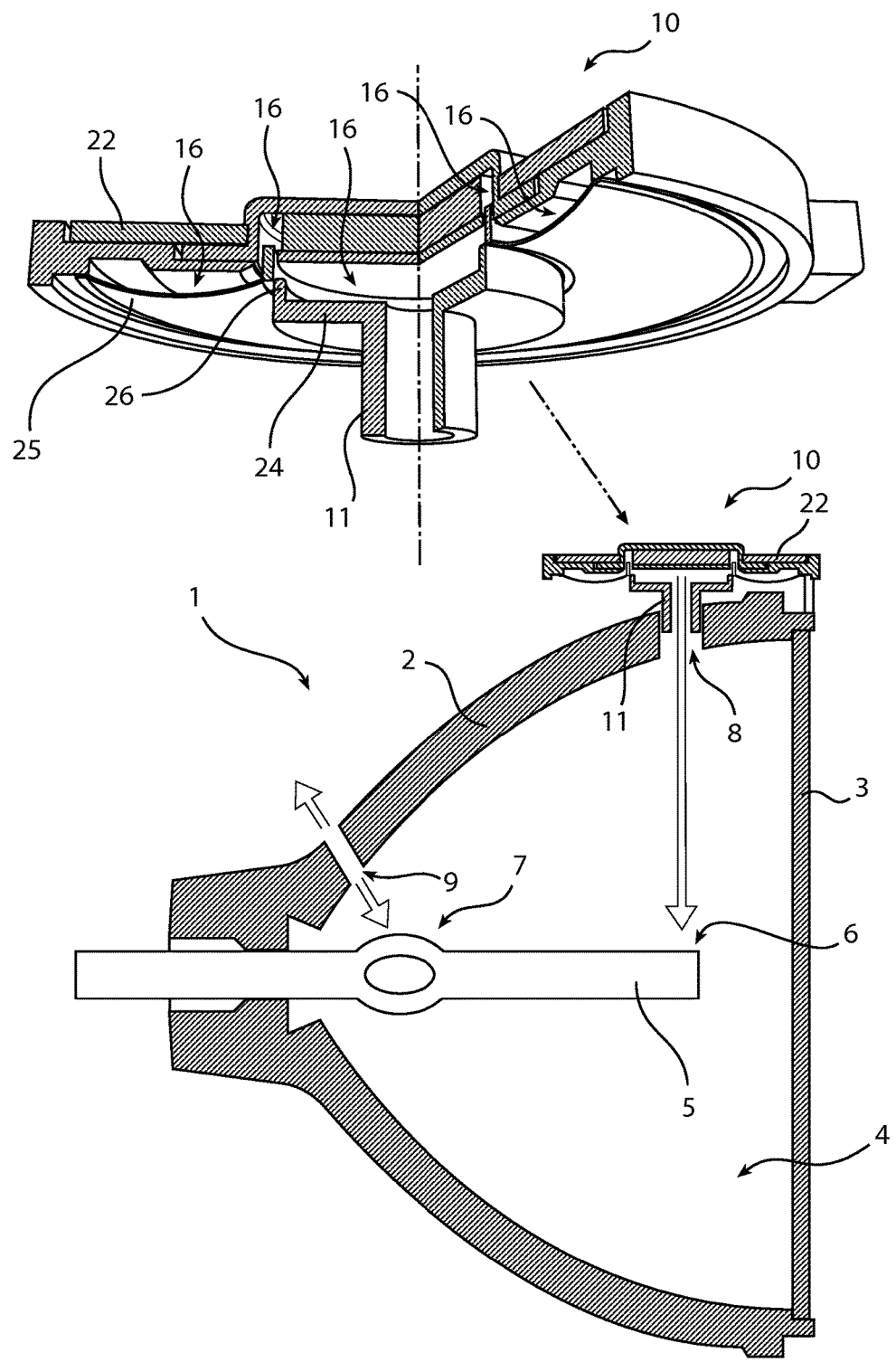
FIG. 2 illustrates an embodiment of a cooling device for an UHP lamp where a loudspeaker actuates a tube. The loudspeaker has a closed back whereby a pumping cavity is formed boosting the internal jet.

FIG. 2 illustrates another embodiment of the invention. Here, a ring 22 is arranged at the back of the loudspeaker 10. The ring seals the back of the loudspeaker so that a cavity 16 is formed by the interior surfaces of the loudspeaker, the flange 24 of the tube and the loudspeaker membrane 25. The cavity 16 is in communication with the enclosure 4 via the actuated aperture 8. The cavity 16, which is sufficiently small to prevent the air in the cavity from acting as a spring in a mass-spring system, modifies the jet formation criterion into $$s > r_{aperture} \cdot A_{aperture} / A_{pump}$$

where
s is the stroke of the transducer (referring to the air rather than the tube)
$r_{aperture}$ is the radius of the aperture,
$A_{aperture}$ is the area of the aperture.
$A_{pump}$ is the area of the actuated surface.

The actuated surface, $A_{pump}$, is here formed by the area of the flange 24 and membrane 25 facing the cavity, and is typically about 50 times the area of the actuated aperture, $A_{aperture}$. This pumps the air and boosts jet formation even with modest loudspeaker stroke. Indirectly this also affects the non-actuated aperture 9 as it increases the volume change in the enclosure 4.

In operation the flange 24 of the tube and the membrane 25 together pump the air in the cavity. Air flows from the part of the cavity near the membrane 25 around the coil 12 to the part of the cavity near the flange 24 to the tube. This flow cools the loudspeaker coil.

Figure 3:
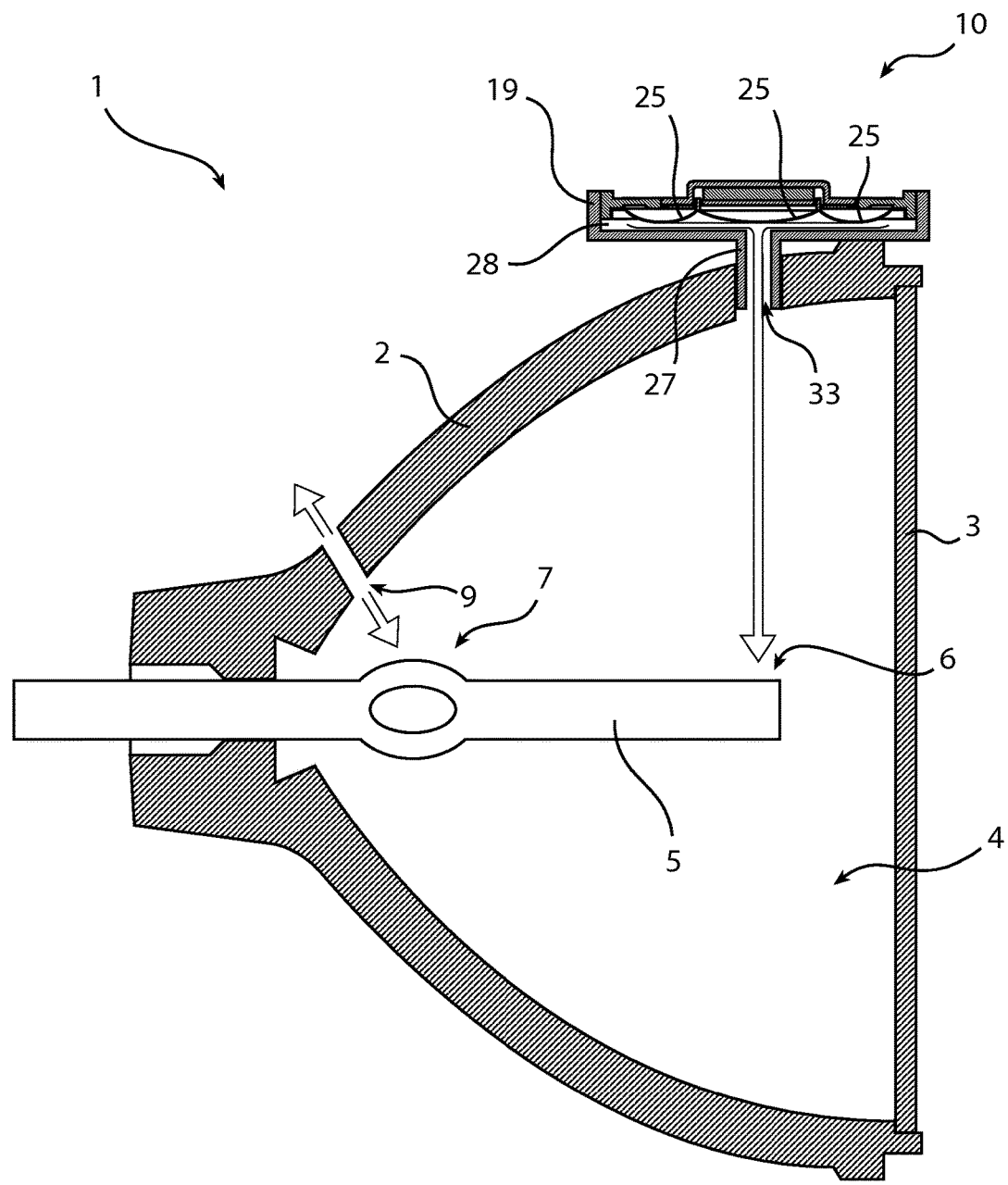
FIG. 3 illustrates an embodiment of a cooling device for an UHP lamp where a housing encloses the front of the loudspeaker, whereby a pumping cavity is formed boosting the internal jet.

FIG. 3 illustrates yet another embodiment of the invention. Here a housing 27, enclosing the front of the loudspeaker 10, has been airtight attached to the loudspeaker 10 to form cavity 28. The housing has an opening forming the actuated aperture 33. The housing 27 preferably has a CTE that matches the UHP lamp, and can be made of for example ceramics. As illustrated in FIG. 3, the housing can be in the form of a tube with a flange, wherein a protrusion 19 on the flange of the tube is attached to the outer edge of the loudspeaker 10. Note that the housing 27 does not move with the stroke of the loudspeaker coil. Furthermore, the connection of the housing 27 to the reflector 2 preferably is airtight.

The cavity 28, which is sufficiently small to prevent the air in the cavity from acting as a spring in a mass-spring system, modifies the jet formation criterion into $$s > r_{aperture} \cdot A_{aperture} / A_{pump}$$

where
s is the stroke of the transducer,
$r_{aperture}$ is the radius of the aperture,
$A_{aperture}$ is the area of the aperture.
$A_{pump}$ is the area of the loudspeaker membrane.

The area of the loudspeaker membrane 25, $A_{pump}$, is typically about 50 times the area of the aperture, $A_{aperture}$, and thus boosts the vortex shedding and cooling considerably. Indirectly this also affects the non-actuated aperture 9 as it increases the volume change in the enclosure 4.

Parameters for two exemplifying embodiments are specified in table 1 below. The first exemplifying embodiment refers to an embodiment having a vibrating tube with a pumping cavity as described above with reference to FIG. 2. The second exemplifying embodiment refers to an embodiment having a loudspeaker arranged in front of a pumping cavity as described above with reference to FIG. 3.

TABLE 1

|  | Vibrating tube with pumping cavity (FIG. 2) | Loudspeaker in front of pumping cavity (FIG. 3) |
|---|---|---|
| Focal length [m] | 0.007 | 0.007 |
| Reflector radius [m] | 0.0325 | 0.0325 |
| Reflector half length [m] | 0.0305 | 0.0305 |
| Reflector half width [m] | 0.027 | 0.027 |
| Burner radius [m] | 0.0045 | 0.0045 |
| Burner length [m] | 0.04 | 0.04 |
| Tube length [m] | 0.006 | 0.006 |
| Aperture radius [m] | 0.0015 | 0.0015 |
| Loudspeaker stroke [m] | 0.0012 | 0.0012 |

TABLE 1-continued

| | Vibrating tube with pumping cavity (FIG. 2) | Loudspeaker in front of pumping cavity (FIG. 3) |
|---|---|---|
| Loudspeaker radius [m] | 0.0107 | 0.0107 |
| Temperature [K] | 300 | 300 |
| Cavity volume [cm³] | 1 | 1 |

Note that in the embodiment having a vibrating tube (depicted in FIG. 2), the resonance frequency of the loudspeaker is preferably tuned to coincide with the resonance frequency of the Helmholtz resonator by adjusting the mass of the tube 11.

The undamped Helmholtz frequency, $f_H$, of the cooling device can be described as:

$$f_H \approx \frac{c}{2\pi}\sqrt{\frac{1}{V}\sum_i \frac{A_i}{L_i + 1.5 \cdot r_i}}, \text{ where}$$

V is the volume of the enclosure less the volume of the quartz burner,
$A_i$ is the cross-sectional area of the aperture
$L_i$ is the length of the aperture
$r_i$ is the aperture radius
i is the number of the aperture and,
c is the speed of sound in the gas (here $20\sqrt{T}$ where T is the temperature in K)

The parameters in table 1 results in the following calculated values.

TABLE 2

| | Vibrating tube with pumping cavity (FIG. 2) | Loudspeaker in front of pumping cavity (FIG. 3) |
|---|---|---|
| Helmholtz frequency [Hz] | 259 | 259 |
| Air velocity [m/s] | 31.07 | 31.69 |
| Volume displacement [m³] | 1.69 · 10⁻⁶ | 1.73 · 10⁻⁶ |
| Relative volume displacement | 2.2% | 2.2% |
| Quality factor | 7.8 | 7.8 |
| Damped Helmholtz frequency [Hz] | 251 | 251 |
| Sound pressure [dB] | 64 | 64 |

The calculated sound intensity is 64 dB. However, in practical experiments the perceived noise turns out to be less.

Figure 4:
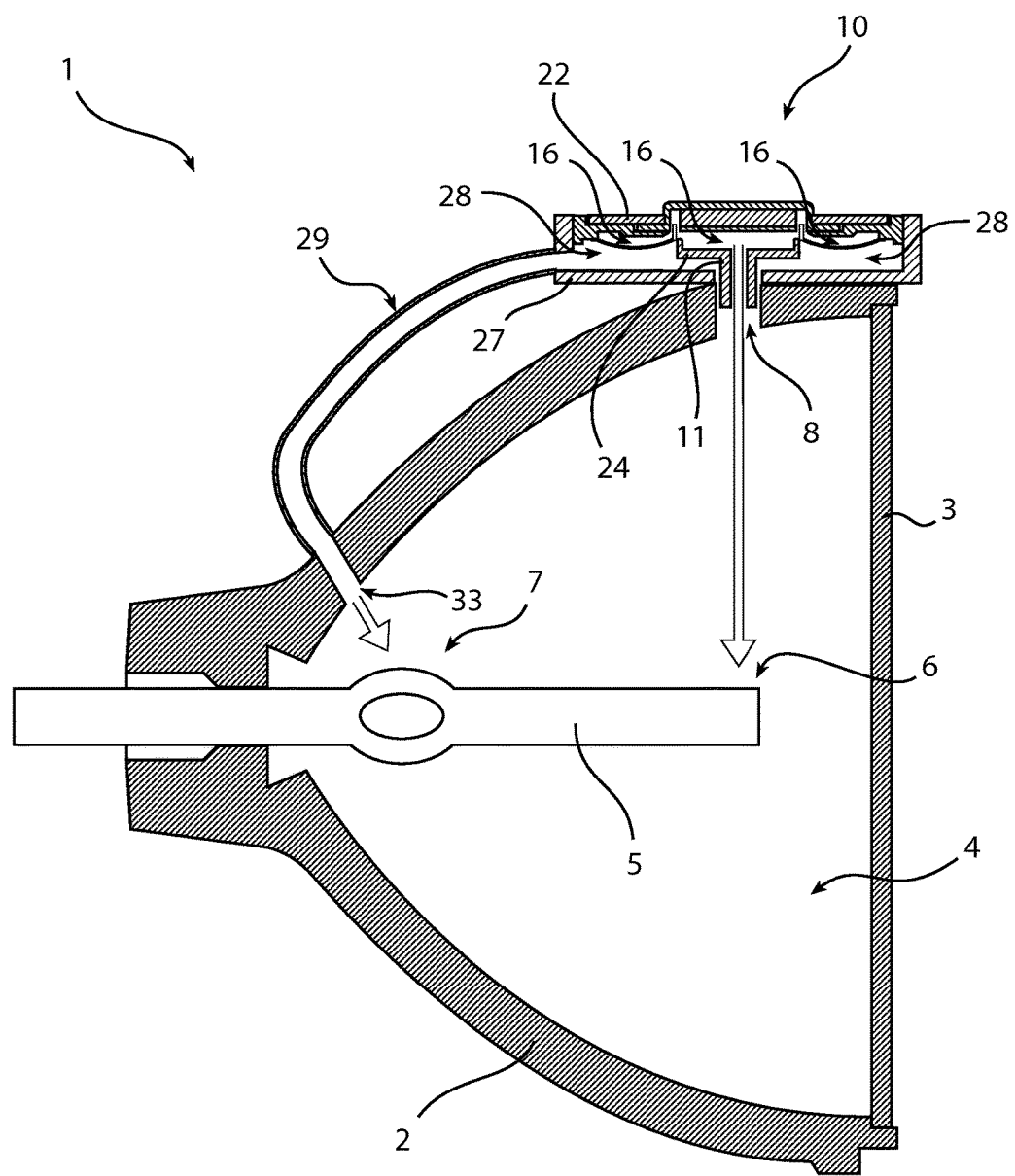
FIG. 4 illustrates an embodiment of a cooling device for an UHP lamp with pumping cavities on either side of the loudspeaker.

FIG. 4 illustrates a combination of the two preceding embodiments (which were describe with reference to FIGS. 2 and 3). Here both sides of the loudspeaker 10 has been closed to create a double action pump. A ring 22 seals the back of the loudspeaker 10 so that a first cavity 16 is formed by the interior surfaces of the loudspeaker, the flange 24 of the tube 11 and the loudspeaker membrane 25. The first cavity 16 is in communication with the enclosure 4 via a first actuated aperture 8 where a synthetic jet is formed. Furthermore, a housing 27, encloses the front of the loudspeaker 10 forming a second cavity 28. The housing here has an opening connected to a second actuated aperture 33 by pipe 29. The additional synthetic jet formed at the second actuated aperture 33 can be utilized to cool an additional hot spot, such as the hot spot 7 at the middle of the quartz burner. By having the length of the pipe 29 to be λ/2, where λ is the wave length of the velocity waves generated by the loudspeaker 10, both apertures 8,33 will breathe simultaneously to enable Helmholtz resonance. Note that the housing 27 does not move with the loudspeaker coil.

According to another embodiment of the invention, there are two adjacent Helmholtz resonators with an aperture in an actuated common wall. This allows cooling of at least one hot spot with clean recirculating air, preventing fouling and dust.

According to yet another embodiment, there are two or more actuated apertures arranged in an enclosure to reduce the audible noise (e.g. by acting as a dipole or quadrapole) and/or be utilized to impinge on a multitude of hot spots. It is recognized that a transducer is already a dipole by itself as long as both sides of the transducer are in communication. Thus, two transducers can make up a quadrupole.

Figure 5:
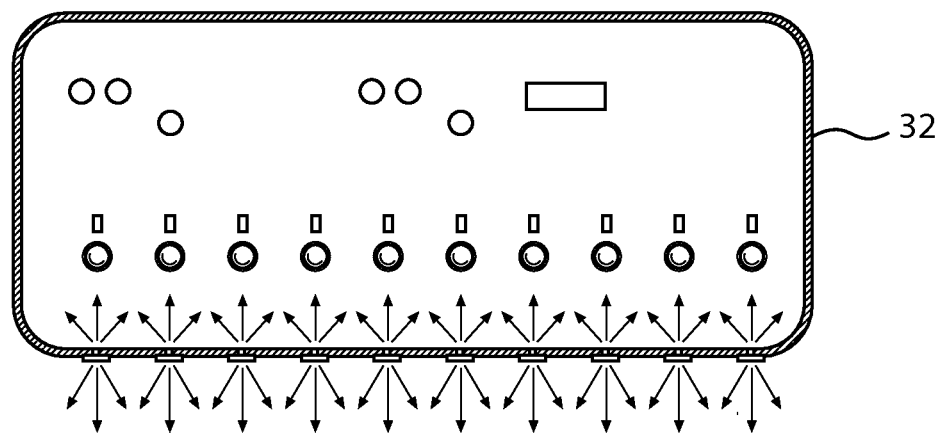
FIG. 5 illustrates an embodiment of a cooling device for a LED backlight.

FIG. 5 illustrates an embodiment of the invention for a LED backlight. Here the LED backlight module 32, may act as a Helmholtz resonator. The LED backlight module 32 may be split into a multitude of compartments (each compartment comprising a subset of LEDs) to improve resonance and/or to operate the compartments pair wise in counter phase to create dipole for noise reduction. Internal synthetic jets here impinge on the heat sinks of the LEDs to force convection.

Figure 6:
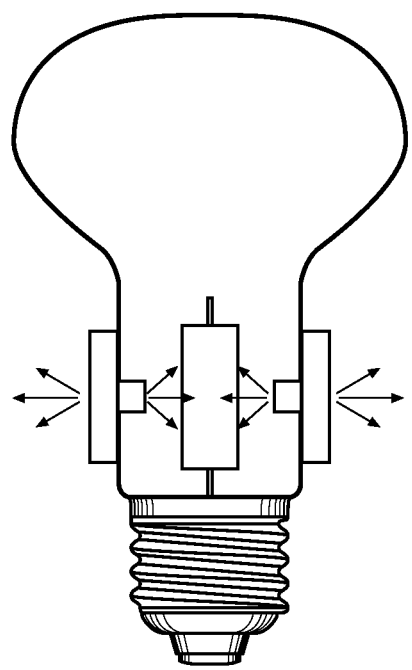
FIG. 6 illustrates an embodiment of a cooling device for a LED spotlight.

FIG. 6 illustrates a LED spotlight, where internal synthetic jets are utilized to cool the dielectric in the capacitor of the power converter which is temperature critical (typically 70-80° C. max).

The invention has mainly been described above with reference to a few embodiments. However, as is readily appreciated by a person skilled in the art, other embodiments than the ones disclosed above are equally possible within the scope of the invention, as defined by the appended claims.

For example, instead of using a tube attached to loudspeaker coil, a perforated membrane could be actuated by the transducer. The membrane may be specularly reflective to fit into, for example, an existing UHP-reflector. Yet another alternative would be an actuated wall having an aperture. It would also be possible to omit or utilize more than one non-actuated aperture. Furthermore, the cooling device may be used for cooling a large variety of objects through outflow of various liquid or gaseous fluids, not only air.

Although the resonance frequency of the device has been in order of magnitude 100 Hz for the described embodiments, the resonance frequency can also be designed to be below the audible range (subsonic) or above the audible range (supersonic) to achieve little audible noise during operation. Furthermore, the cooling device may comprise automatic resonance frequency tuning, as disclosed in WO 2005/027569.

The invention claimed is:

1. A synthetic jet cooling device for cooling an object, the device comprising:
   a transducer for generating velocity waves,
   an enclosure for containing said object therein and arranged to receive said velocity waves via an actuated aperture, said enclosure being dimensioned to generate, at said actuated aperture, an internal synthetic jet inside the enclosure, thereby enabling cooling of said object by said internal synthetic jet,
   a housing enclosing a front of said transducer, whereby a second cavity is formed,
   wherein said enclosure and said actuated aperture are dimensioned to act as a resonating mass-spring system actuated by said transducer, such that fluid in said enclosure acts as a spring, and fluid in said actuated aperture acts as a mass and wherein a diameter of said actuated aperture is between 1/10 and 1/2 of the distance between an end of the actuated aperture and a first hot spot on the object, and wherein said actuated aperture is a bore of a tube attached to a loudspeaker coil of a loudspeaker comprising said transducer, and wherein said second cavity is connected to said second actuated aperture via a pipe having a length of $\lambda/2$, where $\lambda$ is the wave length of the velocity waves generated by the loudspeaker.

2. A synthetic jet cooling device according to claim 1, wherein the stroke of the transducer is larger than the radius of the actuated aperture.

3. A synthetic jet cooling device according to claim 1, wherein the spatial volume change introduced by the transducer is ≥1% of the enclosure volume.

4. A synthetic jet cooling device according to claim 1, further comprising at least one cavity in communication with said enclosure via at least one actuated aperture, fluid in said at least one cavity being actuated by said transducer, wherein said at least one cavity is dimensioned to prevent the fluid therein from acting as a spring in a mass-spring system, and wherein a surface actuated by said transducer is larger than a surface of said at least one aperture.

5. A synthetic jet cooling device according to claim 1, wherein said actuated aperture is arranged in a member actuated by said transducer, said member being a wall, a membrane or a tube.

6. A synthetic jet cooling device according to claim 1, wherein said loudspeaker has a closed back, whereby a first cavity is formed by interior surfaces of said loudspeaker, a flange of said tube, and/or a loudspeaker membrane.

7. A synthetic jet cooling device according to claim 1, wherein said enclosure comprises at least one non-actuated aperture adapted to generate an additional internal synthetic jet inside said enclosure.

* * * * *